(12) United States Patent
Pritchard et al.

(10) Patent No.: US 12,321,208 B2
(45) Date of Patent: Jun. 3, 2025

(54) POWER DELIVERY SYSTEM

(71) Applicant: Dell Products L.P., Round Rock, TX (US)

(72) Inventors: Jason Charles Pritchard, Hopkinton, MA (US); Stephen Edward Strickland, Foxborough, MA (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 229 days.

(21) Appl. No.: 18/314,220

(22) Filed: May 9, 2023

(65) Prior Publication Data

US 2024/0377868 A1 Nov. 14, 2024

(51) Int. Cl.
| | |
|---|---|
| G06F 1/16 | (2006.01) |
| G06F 1/18 | (2006.01) |
| H05K 1/11 | (2006.01) |
| H05K 5/00 | (2025.01) |

(52) U.S. Cl.
CPC ............. *G06F 1/189* (2013.01); *H05K 1/111* (2013.01)

(58) Field of Classification Search
CPC .......... G06F 1/189; G06F 1/183; G06F 1/181; G06F 1/18; H05K 1/111; H05K 1/11
See application file for complete search history.

(56) References Cited

U.S. PATENT DOCUMENTS

| | | | | |
|---|---|---|---|---|
| 6,203,328 | B1* | 3/2001 | Ortega | H01R 12/721 |
| | | | | 439/60 |
| 2011/0136353 | A1* | 6/2011 | Spitaels | H02B 1/056 |
| | | | | 439/95 |
| 2012/0088379 | A1* | 4/2012 | Herring | H01R 4/028 |
| | | | | 439/83 |
| 2013/0061504 | A1* | 3/2013 | Malherbe | F41G 11/003 |
| | | | | 42/84 |
| 2015/0277503 | A1* | 10/2015 | Eremenko | H04W 88/02 |
| | | | | 361/679.4 |
| 2019/0379170 | A1* | 12/2019 | Mulfinger | H01R 25/142 |
| 2020/0244050 | A1* | 7/2020 | Corban | H01R 24/58 |
| 2024/0272682 | A1* | 8/2024 | Ruffini | G06F 1/3206 |

* cited by examiner

*Primary Examiner* — Anthony M Haughton
(74) *Attorney, Agent, or Firm* — McDermott Will & Emery LLP

(57) ABSTRACT

A power delivery system, including: a computing module having: a top surface including a first contact pad; a rail system including a first rail, wherein the first rail includes: a first end opposite to a second end; a first slot extending between the first end and the second end of the first rail, the first slot including a first surface positioned opposite to a second surface, the first surface of the first rail including a first contact finger; wherein, when the computing module is coupled to the rail system: the top surface of the computing module contacts the first surface of the first slot such that the first contact pad of the computing module contacts the first contact finger of the first rail to transfer power from a first power cable through the first contact finger to the first contact pad of the computing module.

16 Claims, 9 Drawing Sheets

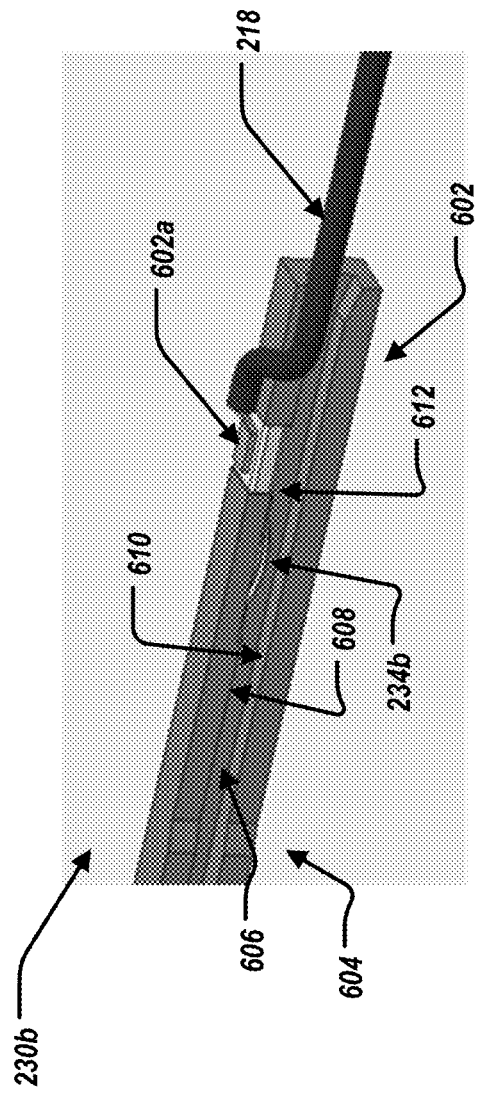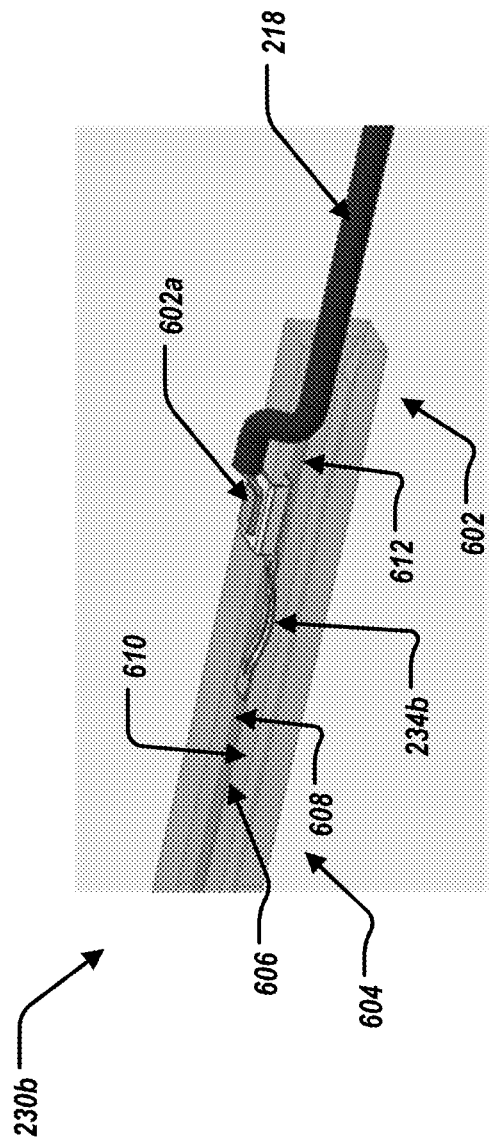

POWER DELIVERY SYSTEM

BACKGROUND

Field of the Disclosure

The disclosure relates generally to a power delivery system for a computing card and/or computing cable.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a method of a power delivery system, including: a computing module having: a top surface including a first contact pad; a rail system including a first rail, wherein the first rail includes: a first end opposite to a second end; a first slot extending between the first end and the second end of the first rail, the first slot including a first surface positioned opposite to a second surface, the first surface of the first rail including a first contact finger; wherein, when the computing module is coupled to the rail system: the top surface of the computing module contacts the first surface of the first slot such that the first contact pad of the computing module contacts the first contact finger of the first rail to transfer power from a first power cable through the first contact finger to the first contact pad of the computing module.

Other embodiments of these aspects include corresponding systems and apparatus.

These and other embodiments may each optionally include one or more of the following features. For instance, the computing module further includes a first side and a second side opposite to the first side, the top surface of the computing module further including a second contact pad, the first contact pad at the first side of the computing module and the second contact pad at the second side of the computing module. The rail system further including a second rail, wherein the second rail includes: a first end opposite to a second end; and a second slot extending between the first end and the second end of the second rail, the second slot including a first surface positioned opposite to a second surface, the first surface of the second rail including a second contact finger. Further including a ground cable coupled to the second contact finger of the second rail. When the computing module is coupled to the rail system, the second contact pad of the computing module contacts the second contact finger of the second rail to return power to the ground cable through the second contact pad of the computing module to the second contact finger of the second rail. Further including a connector, wherein when the computing module is coupled to a computing card, the connector of the computing module is coupled to an interface of the computing card. Further including the first power cable coupled to the first contact finger of the first rail. The computing module is a computing cable.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 6A illustrates a perspective view of a second rail of the power delivery system.

FIG. 6B illustrates a partially transparent perspective view of the second rail of the power delivery system.

DESCRIPTION OF PARTICULAR EMBODIMENT(S)

Figure 1:
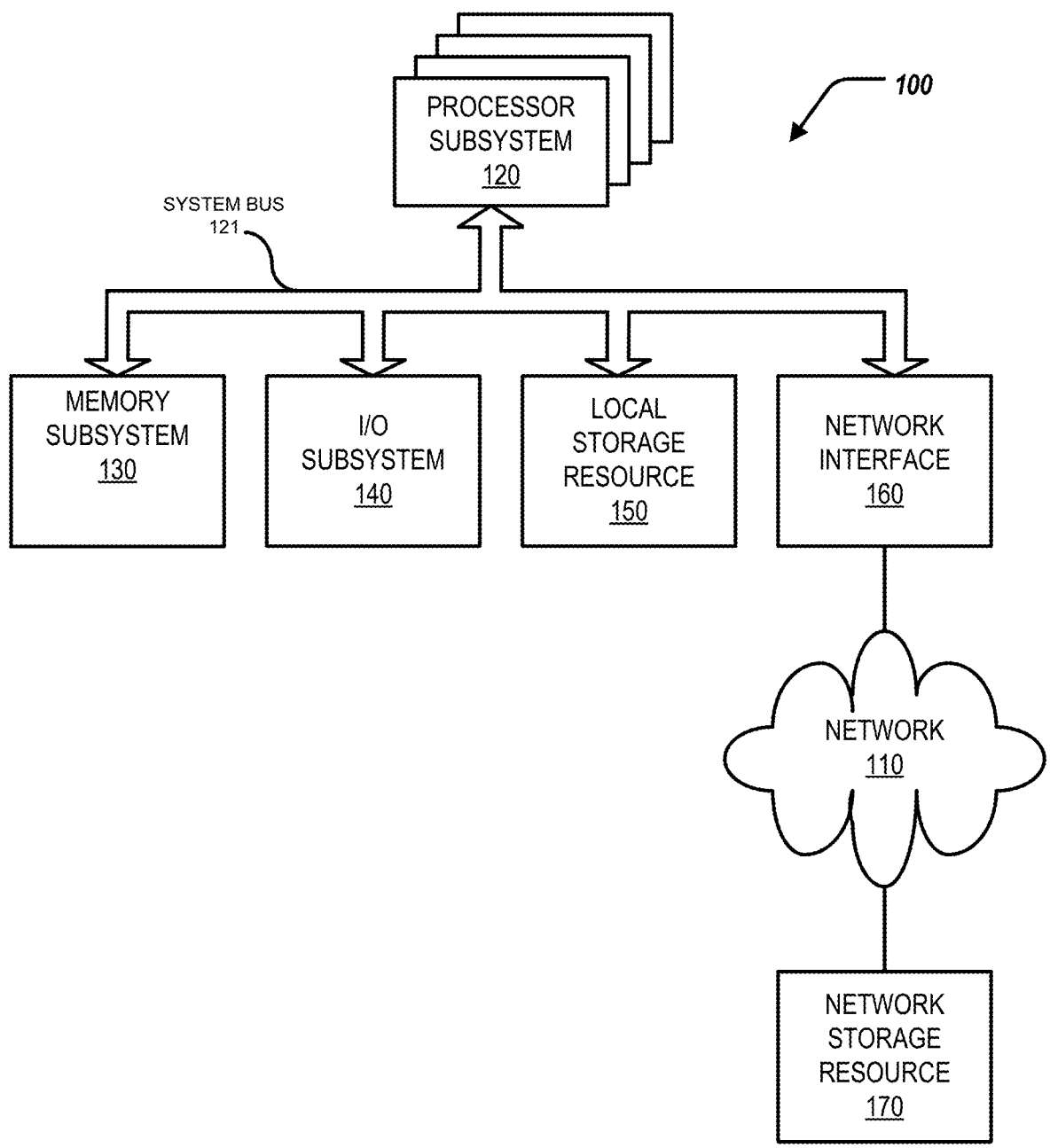
FIG. 1 is a block diagram of selected elements of an embodiment of an information handling system.

This disclosure discusses a power delivery system. In short, a first power cable and a ground cable can facilitate providing power to a computing module when the computing module is coupled to a rail system. Specifically, power can be delivered through rails of the rail system, and contact between contact fingers of the rails and contact pads of the computing module 212, described further herein.

Specifically, this disclosure discusses a power delivery system, including: a computing module having: a top surface including a first contact pad; a rail system including a first rail, wherein the first rail includes: a first end opposite to a second end; a first slot extending between the first end and the second end of the first rail, the first slot including a first surface positioned opposite to a second surface, the first surface of the first rail including a first contact finger; wherein, when the computing module is coupled to the rail system: the top surface of the computing module contacts the first surface of the first slot such that the first contact pad of the computing module contacts the first contact finger of the first rail to transfer power from a first power cable through the first contact finger to the first contact pad of the computing module.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-8 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
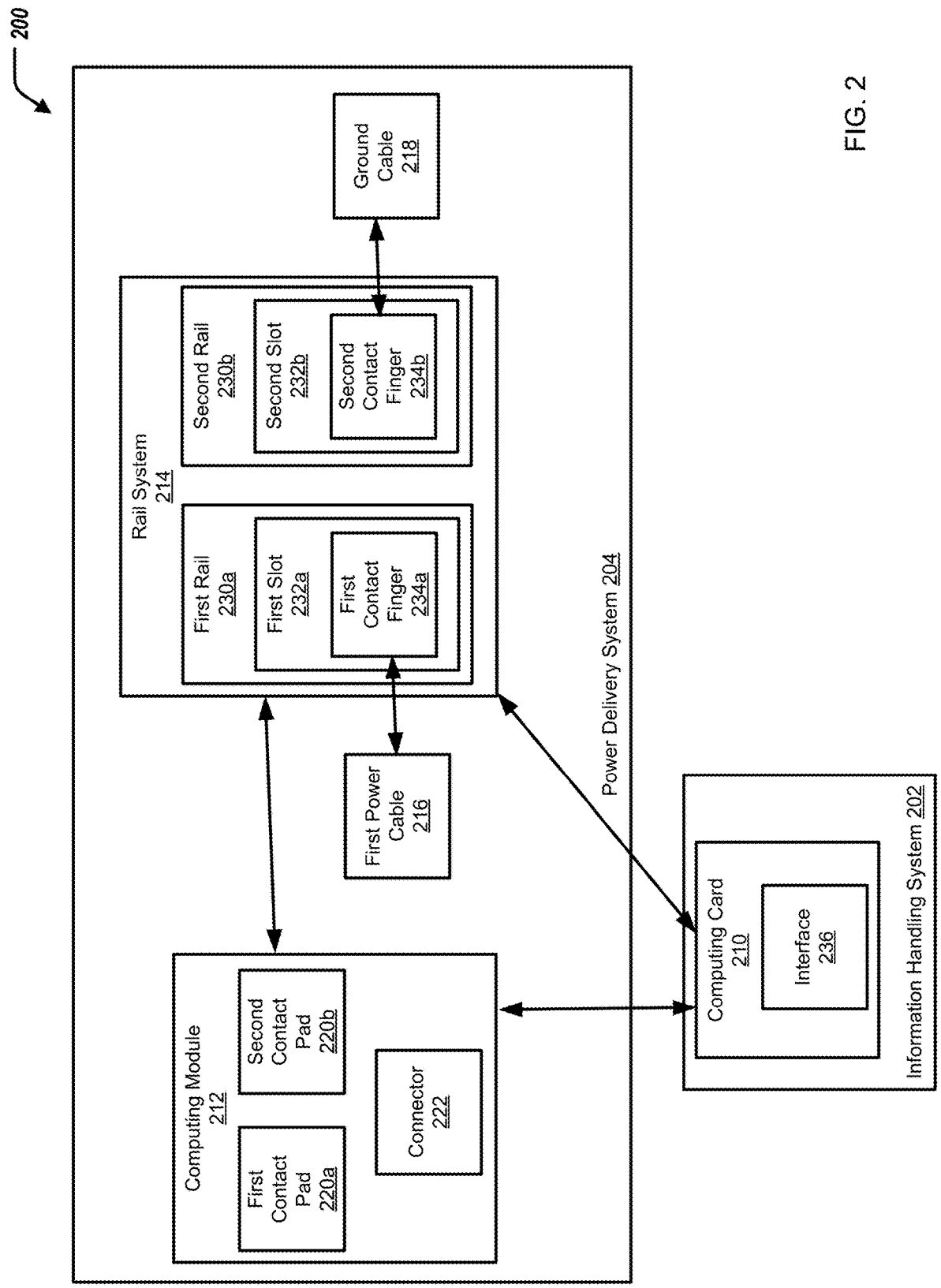
FIG. 2 illustrates a block diagram of an information handling system and a power delivery system.

Turning to FIG. 2, FIG. 2 illustrates an environment 200 including an information handling system 202 and a power delivery system 204. The information handling system 202 can include a computing card 210. In some examples, the information handling system 202 is similar to, or includes, the information handling system 100 of FIG. 1.

The power delivery system 204 can include a computing module 212, a rail system 214, a first power cable 216, and a ground cable 218.

The computing module 212 can include a first contact pad 220a, a second contact pad 220b, and a connector 222. The first contact pad 222a and the second contact pad 222b can be collectively referred to as contact pads 222.

The rail system 214 can include a first rail 230a and a second rail 230b (collectively referred to as rails 230). The first rail 230a can include a first slot 232a and a first contact finger 234a. The second rail 230b can include a second slot 232b and a second contact finger 234b. The first slot 232a and the second slot 232b can collectively be referred to as slots 232. The first contact finger 234a and the second contact finger 234b can collectively be referred to as contact fingers 234.

The computing card 210 can further include an interface 236.

The computing module 212 can be slidably coupled with the rail system 214, described further herein.

The computing card 210 can be removably coupled with the rail system 214.

The computing module 212 can be in communication with the computing card 210.

In short, the first power cable 216 and the ground cable 218 can facilitate providing power to the computing module 212 when the computing module 212 is coupled to the rail system 214. Specifically, power can be delivered through the rails 230, and contact between the contact fingers 234 of the rails 230 and the contact pads 220 of the computing module 212, described further herein.

Figure 3:
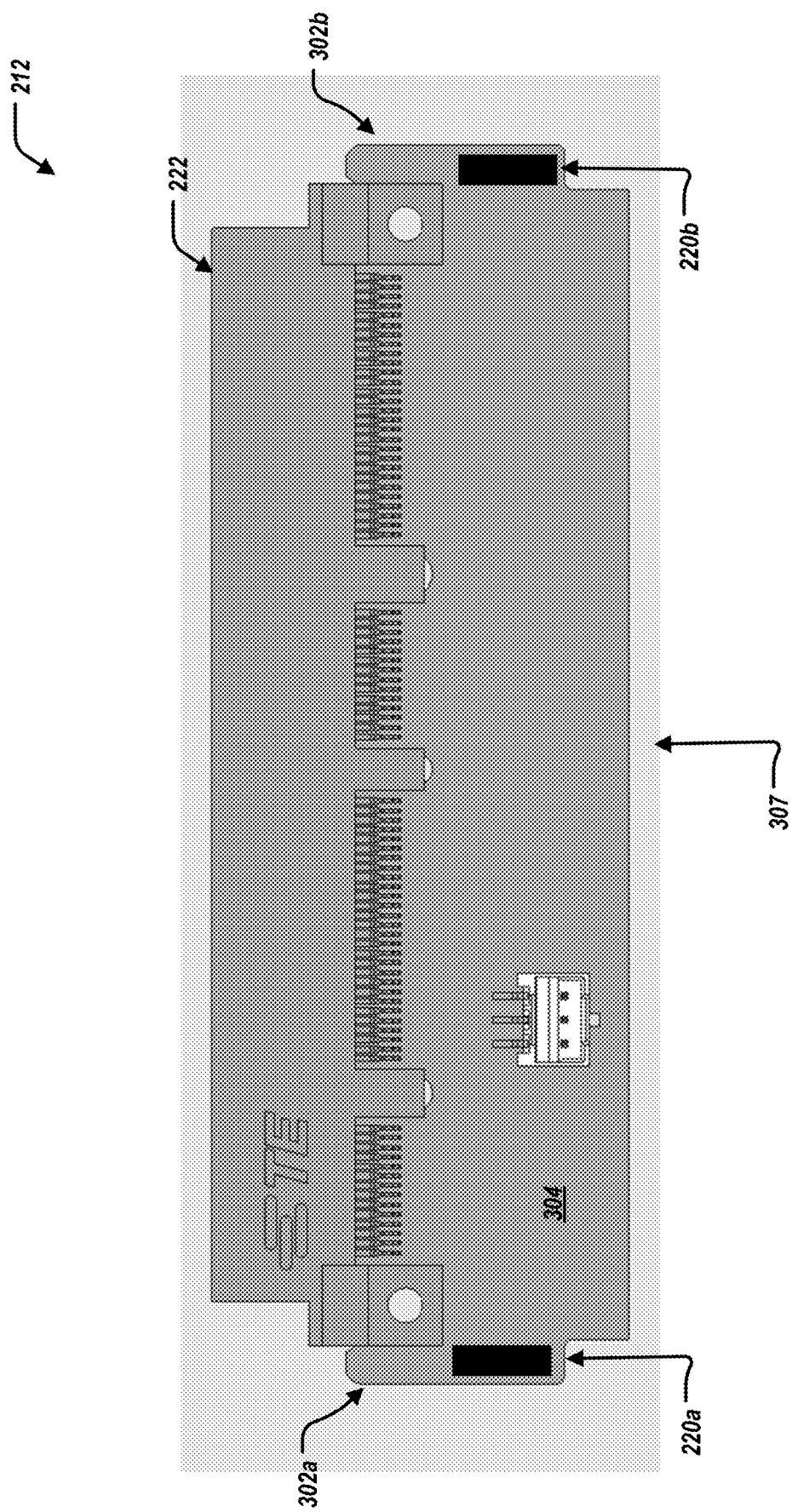
FIG. 3 illustrates a top down view of a computing module of the power delivery system.

FIG. 3 illustrates a top down view of the computing module 212. In some examples, the computing module 212 can include a computing cable. The computing module 212 can include a first side 302a and a second side 302b opposite to the first side 302a. The computing module 212 can further include a top surface 304. The top surface 304 can include the first contact pad 220a and the second contact pad 220b. The first contact pad 220a is at the first side 302a of the computing module 212, and the second contact pad 220b is at the second side 302b of the computing module 212. The computing module 212 can further include a bottom surface 305, opposite to the top surface 304 (shown more clearly in FIG. 4).

In some further examples, the computing module 212 can include a further first contract pad (not shown) at the first side 302a of the computing module 212 on the bottom surface 305 (e.g., opposite to that of the first contact pad 220a). Additionally, the computing module 212 can include a further second contract pad (not shown) at the second side 302b of the computing module 212 on the bottom surface 305 (e.g., opposite to that of the second contact pad 220b).

The computing module 212 can further include the connector 222 and a cable (not shown) connected to a bottom side 307 of the computing module 212.

Figure 4:
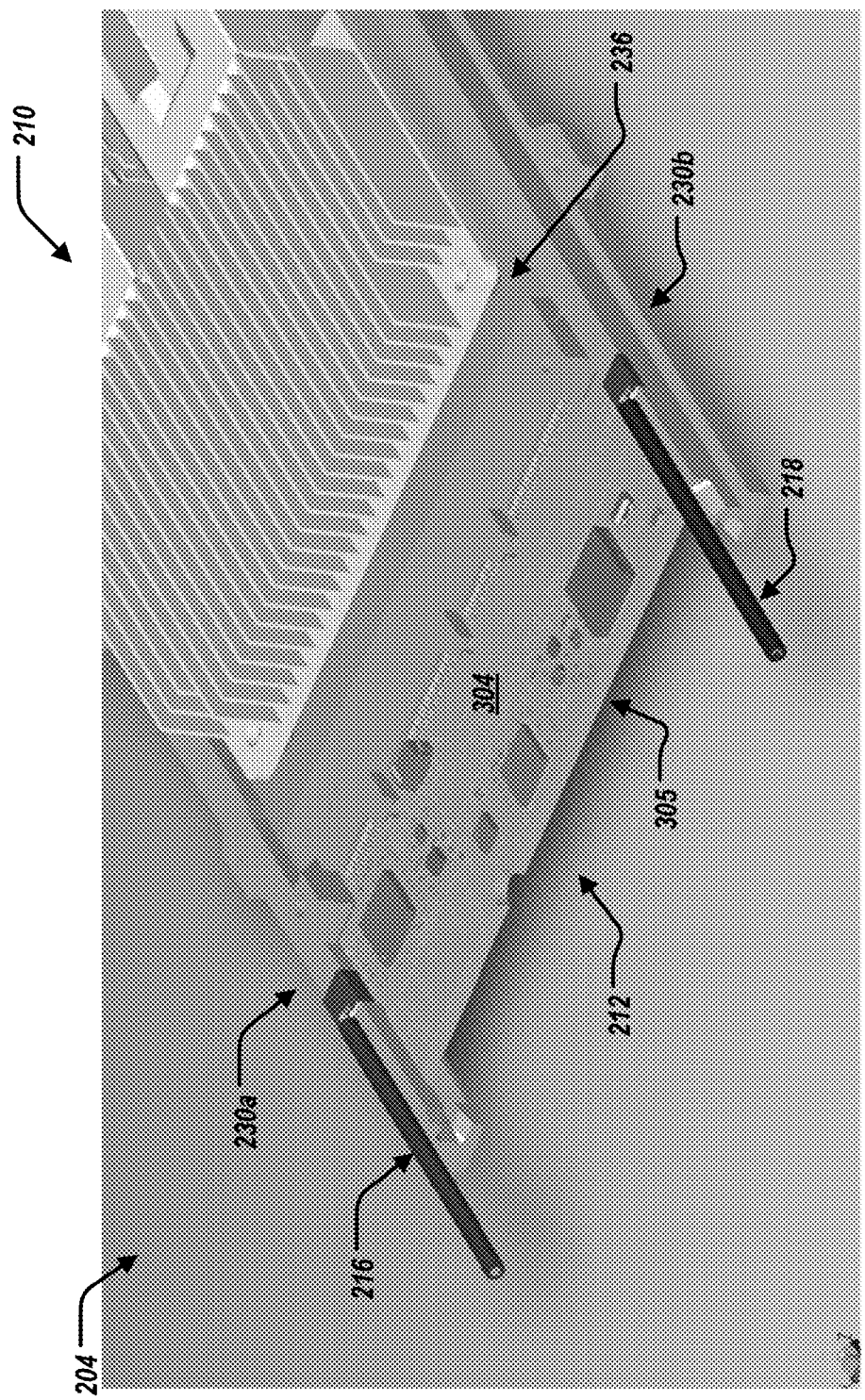
FIG. 4 illustrates a perspective view of the power delivery system.

FIG. 4 illustrates a perspective view of the power delivery system 204. The power delivery system 204 can include the rail system 214, and in particular, the first rail 230a and the second rail 230b. The computing card 210 can include the interface 236.

Figure 5A:
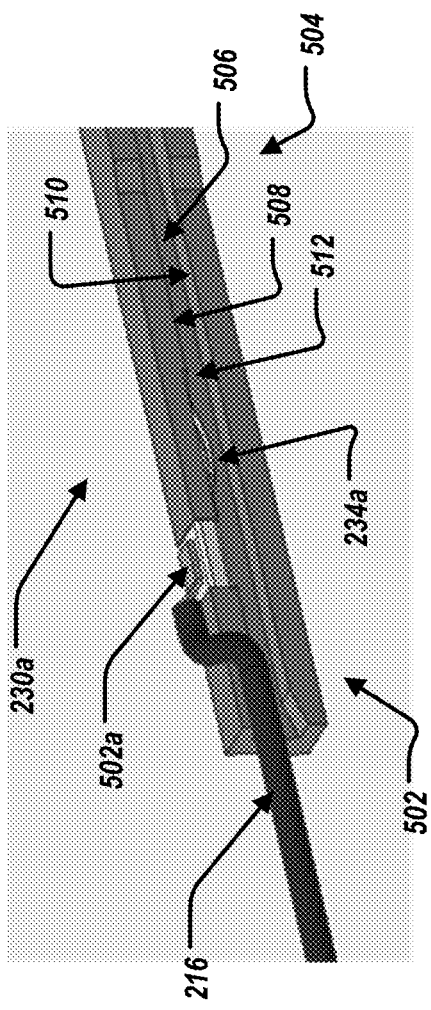
FIG. 5A illustrates a perspective view of a first rail of the power delivery system.
Figure 5B:
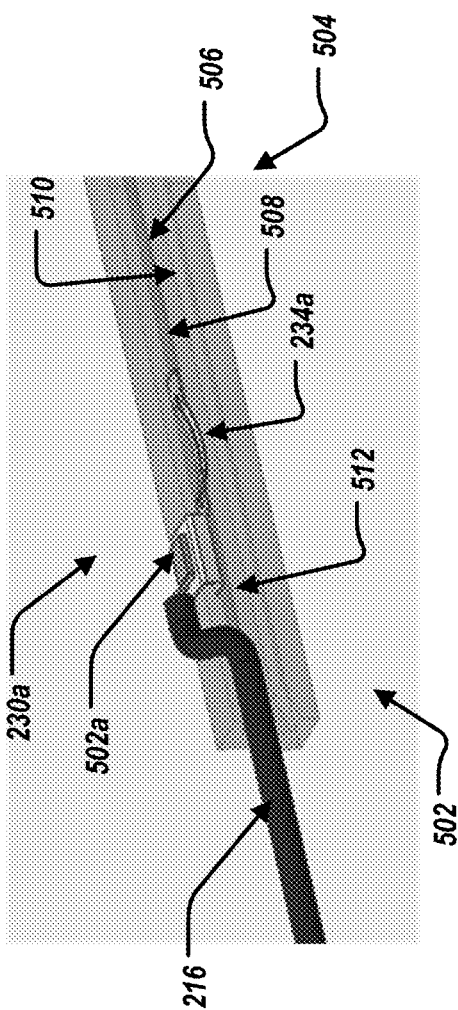
FIG. 5B illustrates a partially transparent perspective view of the first rail of the power delivery system.

FIG. 5A illustrates a perspective view of the first rail 230a; and FIG. 5B illustrates a partially transparent view of the first rail 230a. The first rail 230a can include a first end 502 opposite to a second end 504. The first rail 230a can further include a first slot 506 extending between the first end 502 and the second end 504. The first slot 504 can include a first surface 508 positioned opposite to a second surface 510. A side surface 512 can extend between the first surface 508 and the second surface 510. The first surface 508 of the first rail 230a can include the first contact finger 234a (or multiple first contact fingers 234a). The first power cable 216 can be coupled to the first contact finger 234a of the first rail 230a via a contact interface 502a.

In some further examples, the second surface 510 of the first rail 230a can include an additional first contact finger.

In some examples, the ground cable 218 can be coupled to the additional first contact finger of the first rail 230a.

FIG. 6A illustrates a perspective view of the second rail 230b; and FIG. 6B illustrates a partially transparent view of the second rail 230b. The second rail 230b can include a first end 602 opposite to a second end 604. The second rail 230b can further include a second slot 606 extending between the first end 602 and the second end 604. The second slot 606 can include a first surface 608 positioned opposite to a second surface 610. A side surface 612 can extend between the first surface 608 and the second surface 610. The first surface 608 of the second rail 230b can include the second contact finger 234b (or multiple second contact fingers 234b). The ground cable 218 can be coupled to the second contact finger 234b of the second rail 230b via a contact interface 602a.

In some further examples, the second surface 610 of the second rail 230b can include an additional second contact finger. In some examples, the first power cable 216 can be coupled to the additional second contact finger of the second rail 230b.

Referring to FIGS. 4, 5A, 5B, 6A, 6B, the computing module 212 is coupled to the rail system 214. That is, the computing module 212 (computing cable) is able to be slideably coupled to the rail system 214. That is, the computing module 212 is "slid" into the rail system 214 such that the computing module 212 is positioned within the first slot 504 and the second slot 506. Specifically, when the computing module 212 is coupled to the rail system 214, the top surface 304 of the computing module 212 contacts the first surface 508 of the first rail 230a and the first surface 608 of the second rail 230b; and/or the bottom surface 305 of the computing module 212 contacts the second surface 510 of the first rail 230a and the second surface 610 of the second rail 230b.

Figure 7A:
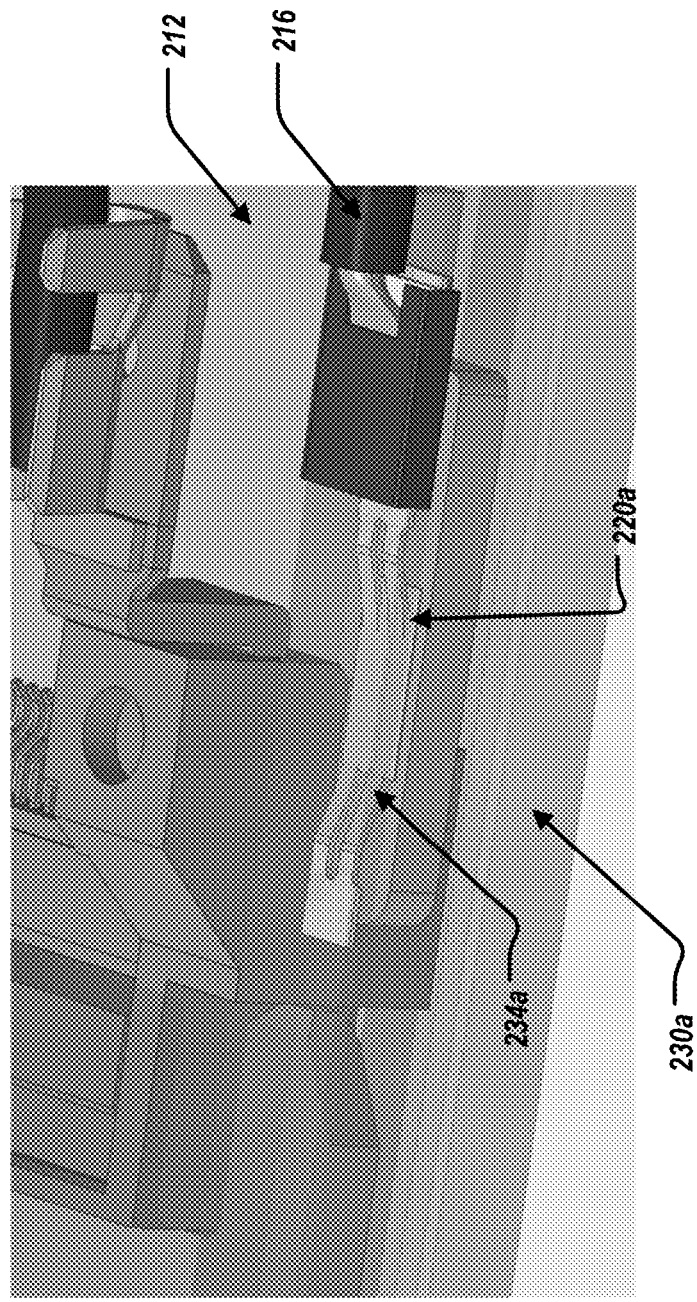
FIG. 7A illustrates a partially transparent view of the computing module coupled to the first rail.
Figure 7B:
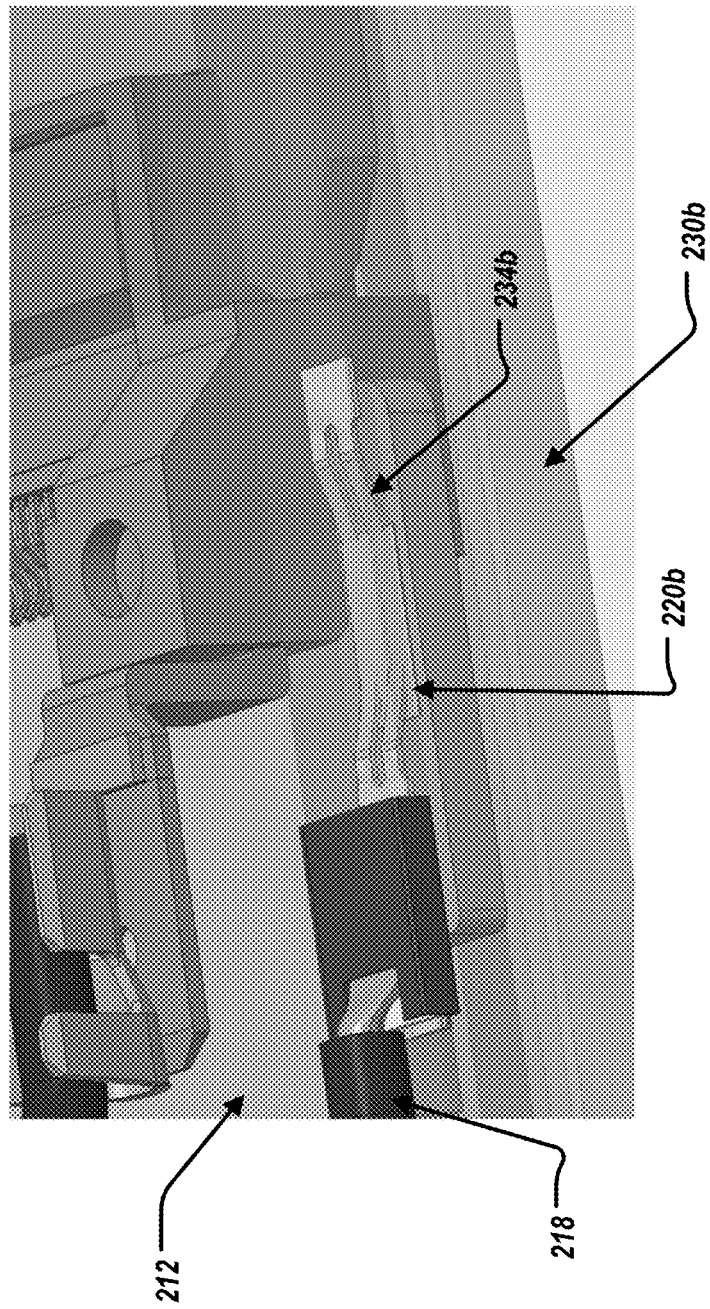
FIG. 7B illustrate a partially transparent view of the computing module coupled to the second rail.

FIG. 7A illustrates a partially transparent view of the computing module 212 coupled to the first rail 230a; and FIG. 7B illustrate a partially transparent view of the computing module 212 coupled to the second rail 230b. Referring to FIGS. 4, 5A, 5B, 6A, 6B, 7A, 7B, furthermore, when the computing module 212 is coupled to the rail system 214, the top surface 304 of the computing module 212 contacts the first surface 508 of the first rail 230a and the first surface 608 of the second rail 230b; and/or the bottom surface 305 of the computing module 212 contacts the second surface 510 of the first rail 230a and the second surface 610 of the second rail 230b such that the first contact pad 220a of the computing module 212 contacts the first contact finger 234a of the first rail 230a. The first contact pad 220a of the computing module 212 contacts the first contact finger 234a of the first rail 230a to transfer power from the first power cable 216 through the first contact finger 234a to the first contact pad 220a of the computing module 212 to deliver power to the computing module 212. In some examples, the additional first contact pad of the computing module 212 contacts the additional first contact finger of the first rail 230a to return power to the ground power cable 218 through the additional first contact pad of the computing module 212 to the additional first contact finger of the first rail 230a.

Similarly, when the computing module 212 is coupled to the rail system 214, the top surface 304 of the computing module 212 contacts the first surface 508 of the first rail 230a and the first surface 608 of the second rail 230b; and/or the bottom surface 305 of the computing module 212 contacts the second surface 510 of the first rail 230a and the second surface 610 of the second rail 230b such that the second contact pad 220b of the computing module 212 contacts the second contact finger 234b of the second rail 230b. The second contact pad 220b of the computing module 212 contacts the second contact finger 234b of the second rail 230b to return power to the ground cable 218 through the second contact pad 220b of the computing module 212 to the second contact finger 234b of the second rail 230b. In some examples, the additional second contact pad of the computing module 212 contacts the additional second contact finger of the second rail 230b to transfer power from the first power cable 216 through the additional second contact finger to the additional second contact pad of the computing module 212 to deliver power to the computing module 212.

Referring to FIGS. 3 and 4, additionally, when the computing module 212 is coupled to the rail system 214 and coupled to the computing card 210, the connector 222 of the computing module 212 is coupled to the interface 236 of the computing card 210.

Referring to FIGS. 4, 5A, 5B, 6A, 6B, furthermore, the computing card 210 is coupled with the rail system 214. That is, the computing card 210 is able to be slideably coupled to the rail system 214. That is, the computing card 210 is "slid" into the rail system 214 such that the computing card 210 is positioned within the first slot 506 and the second slot 606. In some examples, the computing module 212 and the computing card 210 are coupled to the rail system 214 from opposite ends of the rail system 214.

Referring to FIGS. 4, 7A, 7B, to that end, when the computing card 210 is coupled to the rail system 214 and the computing module 212 (computing cable) is coupled to the rail system 214, the computing module 212 can provide power to the computing card 210. Specifically, when the computing module 212 is coupled to the rail system 214, the first contact pad 220a of the computing module 212 contacts the first contact finger 234a of the first rail 230a and the second contact pad 220b of the computing module 212 contacts the second contact finger 234b of the second rail 230b to transfer power through the first power cable 216 and the ground cable 218 to the computing module 212. The computing module 212 then transfers power to the computing card 210 through the connector 222 and the interface 236 of the rail system 214.

Figure 8:
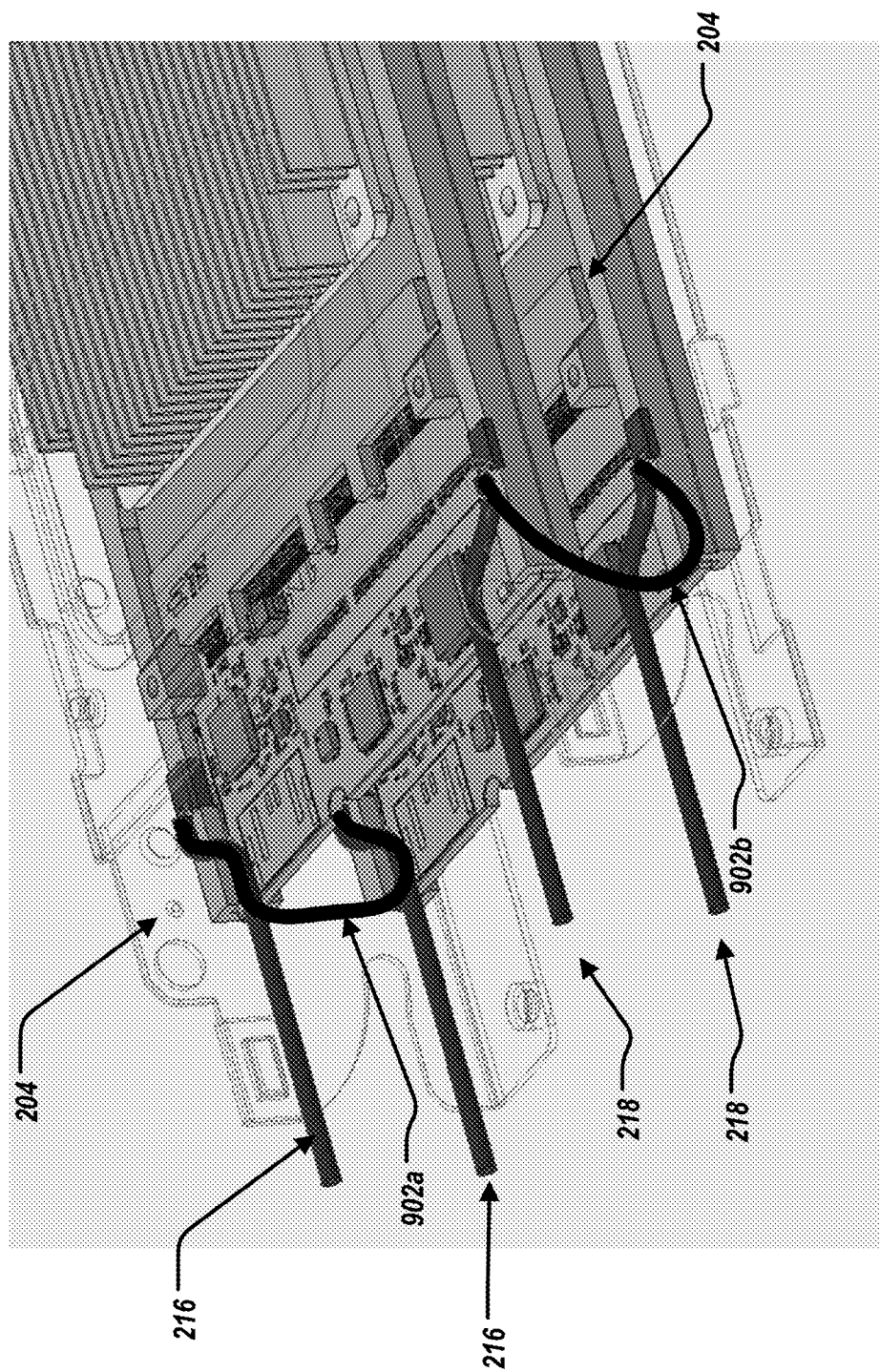
FIG. 8 illustrates a perspective view of multiple power delivery systems.

FIG. 8 illustrates a perspective view of multiple power delivery systems 204. In some examples, each of the power delivery systems 204 can be connected to one another in series ("daisy-chained"). That is, a cable 902a can couple the first power cables 216 together (connect the first power cables 216 together) and a cable 902b can couple the ground cables 218 together (connect the ground cables 218 together).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A power delivery system, including:
    a computing module having:
        a top surface including a first contact pad;
    a rail system including a first rail, wherein
        the first rail includes:
            a first end opposite to a second end;
            a first slot extending between the first end and the second end of the first rail, the first slot including a first surface positioned opposite to a second surface, the first surface of the first rail including a first contact finger;
    wherein, when the computing module is coupled to the rail system:
        the top surface of the computing module contacts the first surface of the first slot such that the first contact pad of the computing module contacts the first contact finger of the first rail to transfer power from a first power cable through the first contact finger to the first contact pad of the computing module.

2. The system of claim 1, wherein the computing module further includes a first side and a second side opposite to the first side, the top surface of the computing module further including a second contact pad, the first contact pad at the first side of the computing module and the second contact pad at the second side of the computing module.

3. The system of claim 2, the rail system further including a second rail, wherein
    the second rail includes:
        a first end opposite to a second end; and
        a second slot extending between the first end and the second end of the second rail, the second slot including a first surface positioned opposite to a second surface, the first surface of the second rail including a second contact finger.

4. The system of claim 3, further including a ground cable coupled to the second contact finger of the second rail.

5. The system of claim 4, wherein when the computing module is coupled to the rail system, the second contact pad of the computing module contacts the second contact finger of the second rail to return power to the ground cable through the second contact pad of the computing module to the second contact finger of the second rail.

6. The system of claim 5, the computing module further including a connector, wherein when the computing module is coupled to a computing card, the connector of the computing module is coupled to an interface of the computing card.

7. The system of claim 6, further including the first power cable coupled to the first contact finger of the first rail.

8. The system of claim 1, wherein the computing module is a computing cable.

9. A power delivery system, including:
    a computing module having:
        a top surface including a first contact pad;
    a connector;
    a rail system including a first rail, wherein
        the first rail includes:
            a first end opposite to a second end;
            a first slot extending between the first end and the second end of the first rail, the first slot including a first surface positioned opposite to a second surface, the first surface of the first rail including a first contact finger;
        a first power cable coupled to the first contact finger of the first rail;
    wherein, when the computing module is coupled to the rail system:
        the top surface of the computing module contacts the first surface of the first slot such that the first contact pad of the computing module contacts the first contact finger of the first rail to transfer power from the first power cable through the first contact finger to the first contact pad of the computing module to deliver power to the computing module.

10. The system of claim 9, wherein the computing module further includes a first side and a second side opposite to the first side, the top surface of the computing module further including a second contact pad, the first contact pad at the first side of the computing module and the second contact pad at the second side of the computing module.

11. The system of claim 10, wherein the rail system further includes a second rail, wherein
    the second rail includes:
        a first end opposite to a second end; and
        a second slot extending between the first end and the second end of the second rail, the second slot including a first surface positioned opposite to a second surface, the first surface of the second rail including a second contact finger.

12. The system of claim 11, further including a ground cable coupled to the second contact finger of the second rail.

13. The system of claim 12, wherein when the computing module is coupled to the rail system, the second contact pad of the computing module contacts the second contact finger of the second rail to return power to the ground cable through the second contact pad of the computing module to the second contact finger of the second rail.

14. The system of claim 9, wherein the computing module is a computing cable.

15. A power delivery system, including:
    a computing module having:
        a first side;
        a second side opposite to the first side;
        a top surface, the top surface including a first contact pad and a second contact pad, the first contact pad at the first side of the computing module and the second contact pad at the second side of the computing module;
        a connector;

a rail system including a first rail, a second rail, wherein the first rail includes:
   a first end opposite to a second end;
   a first slot extending between the first end and the second end of the first rail, the first slot including a first surface positioned opposite to a second surface, the first surface of the first rail including a first contact finger;
the second rail includes:
a first end opposite to a second end;
   a second slot extending between the first end and the second end of the second rail, the second slot including a first surface positioned opposite to a second surface, the first surface of the second rail including a second contact finger;
a first power cable coupled to the first contact finger of the first rail;
a ground cable coupled to the second contact finger of the second rail;

wherein, when the computing module is coupled to the rail system:

the top surface of the computing module contacts the first surface of the first slot and the first surface of the second slot such that i) the first contact pad of the computing module contacts the first contact finger of the first rail to transfer power from the first power cable through the first contact finger to the first contact pad of the computing module to deliver power to the computing module and ii) the second contact pad of the computing module contacts the second contact finger of the second rail to return power to the ground cable through the second contact pad of the computing module to the second contact finger of the second rail.

16. The system of claim 15, wherein the computing module is a computing cable.

* * * * *